United States Patent
Walker et al.

(10) Patent No.: US 11,294,005 B2
(45) Date of Patent: Apr. 5, 2022

(54) SYNCHRONOUS LIGHT-PULSE ATOMIC MAGNETOMETER SYSTEM

(71) Applicants: Thad G. Walker, Middleton, WI (US); Michael D. Bulatowicz, Sun Prairie, WI (US)

(72) Inventors: Thad G. Walker, Middleton, WI (US); Michael D. Bulatowicz, Sun Prairie, WI (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/928,609

(22) Filed: Jul. 14, 2020

(65) Prior Publication Data

US 2022/0018913 A1 Jan. 20, 2022

(51) Int. Cl.
*G01R 33/26* (2006.01)

(52) U.S. Cl.
CPC .................. *G01R 33/26* (2013.01)

(58) Field of Classification Search
CPC ........ G01R 33/26; G01R 33/24; G01R 33/20; G01N 24/006; G01N 24/00; H01S 3/091; A61B 5/055
See application file for complete search history.

(56) References Cited

U.S. PATENT DOCUMENTS

| | | | |
|---|---|---|---|
| 5,189,368 A | 2/1993 | Chase | |
| 6,314,215 B1 | 11/2001 | Shay et al. | |
| 6,472,869 B1 | 10/2002 | Upschulte et al. | |
| 7,038,450 B2 | 5/2006 | Romalis et al. | |
| 7,145,333 B2 | 12/2006 | Romalis et al. | |
| 7,521,928 B2 | 4/2009 | Romalis et al. | |
| 7,826,065 B1 | 11/2010 | Okandan et al. | |
| 7,856,065 B2 | 12/2010 | Jonsson | |

(Continued)

FOREIGN PATENT DOCUMENTS

| | | |
|---|---|---|
| EP | 3410142 A1 | 12/2018 |
| JP | 2018-004462 A | 1/2018 |

OTHER PUBLICATIONS

Extended European Search Report (EESR) for corresponding EP 21183720.8, dated Dec. 8, 2021.

*Primary Examiner* — Jay Patidar
(74) *Attorney, Agent, or Firm* — Tarolli, Sundheim, Covell & Tummino LLP

(57) ABSTRACT

One example includes a magnetometer that includes a sensor cell comprising alkali metal vapor and a magnetic field generator system that generates predetermined AC magnetic fields through the sensor cell. The magnetometer also includes a laser system to provide optical pump and probe beams through the sensor cell in a pulsed manner to facilitate precession of the alkali metal vapor and to provide a detection beam corresponding to the optical probe beam exiting the sensor cell. The detection beam exhibits an optical property corresponding to a modified precession of the alkali metal vapor based on the predetermined AC magnetic fields and an external magnetic field. The magnetometer also includes a detection system to monitor the detection beam to detect the modified precession of the alkali metal vapor to calculate scalar and vector components of the external magnetic field based on the plurality of predetermined AC magnetic fields.

17 Claims, 2 Drawing Sheets

(56) References Cited

U.S. PATENT DOCUMENTS

| | | |
|---|---|---|
| 7,994,783 B2 | 8/2011 | Ledbetter et al. |
| 8,054,074 B2 | 11/2011 | Ichihara et al. |
| 8,212,556 B1 | 7/2012 | Schwindt et al. |
| 8,300,566 B2 | 10/2012 | Kuo |
| 8,305,078 B2 | 11/2012 | Savukov et al. |
| 8,405,389 B2 | 3/2013 | Sugioka et al. |
| 8,421,455 B1 | 4/2013 | Hovde et al. |
| 8,519,705 B2 | 8/2013 | Savukov et al. |
| 8,587,304 B2 | 11/2013 | Budker et al. |
| 8,605,282 B2 | 12/2013 | Groswasser |
| 8,773,120 B2 | 7/2014 | Jager et al. |
| 9,116,201 B2 | 8/2015 | Shah et al. |
| 9,140,657 B2 | 9/2015 | Ledbetter et al. |
| 9,229,073 B2 | 1/2016 | Walker et al. |
| 9,366,735 B2 | 6/2016 | Kawabata et al. |
| 9,575,144 B2 | 2/2017 | Kornack et al. |
| 9,618,362 B2 | 4/2017 | Bulatowicz et al. |
| 9,638,768 B2 | 5/2017 | Foley et al. |
| 9,857,441 B2 | 1/2018 | Salit et al. |
| 9,869,731 B1 | 1/2018 | Hovde et al. |
| 9,927,501 B2 | 3/2018 | Kim et al. |
| 9,964,610 B2 | 5/2018 | Shah et al. |
| 9,995,800 B1 * | 6/2018 | Schwindt ............... G01R 33/26 |
| 10,024,931 B2 | 7/2018 | Nagasaka et al. |
| 10,162,021 B2 | 12/2018 | Kawabata et al. |
| 10,215,816 B2 | 2/2019 | Kawabata et al. |
| 10,274,549 B1 | 4/2019 | Ledbetter et al. |
| 10,288,701 B2 | 5/2019 | Kobayashi et al. |
| 2005/0052650 A1 | 3/2005 | Wu |
| 2009/0243610 A1 | 10/2009 | Ichihara et al. |
| 2009/0256561 A1 | 10/2009 | Ledbetter et al. |
| 2010/0090697 A1 | 4/2010 | Savukov et al. |
| 2010/0156547 A1 | 6/2010 | McGuyer et al. |
| 2010/0289491 A1 | 11/2010 | Budker et al. |
| 2010/0308814 A1 | 12/2010 | Wu |
| 2011/0031969 A1 * | 2/2011 | Kitching ............ G01R 33/0286 324/304 |
| 2011/0193555 A1 | 8/2011 | Sugioka et al. |
| 2011/0279115 A1 | 11/2011 | Tuchman |
| 2012/0112749 A1 | 5/2012 | Budker et al. |
| 2012/0176130 A1 | 7/2012 | Ledbetter et al. |
| 2013/0027041 A1 | 1/2013 | Savukov et al. |
| 2013/0214773 A1 | 8/2013 | Ueno |
| 2013/0265042 A1 | 10/2013 | Kawabata et al. |
| 2014/0111198 A1 | 4/2014 | Tuchman |
| 2014/0159718 A1 * | 6/2014 | Larsen ................. G01R 33/60 324/301 |
| 2014/0184216 A1 | 7/2014 | Walker et al. |
| 2014/0206981 A1 | 7/2014 | Nagasaka |
| 2014/0247045 A1 | 9/2014 | Kornack et al. |
| 2014/0375313 A1 | 12/2014 | Salit et al. |
| 2015/0042327 A1 | 2/2015 | Bulatowicz |
| 2015/0212168 A1 | 7/2015 | Shah et al. |
| 2015/0316625 A1 | 11/2015 | Bulatowicz |
| 2015/0330786 A1 | 11/2015 | Bulatowicz et al. |
| 2015/0346293 A1 | 12/2015 | Bulatowicz et al. |
| 2016/0116553 A1 | 4/2016 | Kim et al. |
| 2016/0146909 A1 | 5/2016 | Kawabata et al. |
| 2016/0223627 A1 | 8/2016 | Shah et al. |
| 2016/0231395 A1 | 8/2016 | Foley et al. |
| 2016/0313417 A1 | 10/2016 | Kawabata et al. |
| 2016/0334475 A1 | 11/2016 | Ueno |
| 2017/0276741 A1 | 9/2017 | Bulatowicz |
| 2018/0348313 A1 | 12/2018 | Bulatowicz et al. |
| 2018/0372813 A1 | 12/2018 | Bulatowicz et al. |
| 2019/0101611 A1 | 4/2019 | Bulatowicz et al. |
| 2019/0250223 A1 | 8/2019 | Palacios Laloy |
| 2019/0293736 A1 | 9/2019 | Bulatowicz |

* cited by examiner

SYNCHRONOUS LIGHT-PULSE ATOMIC MAGNETOMETER SYSTEM

TECHNICAL FIELD

This disclosure relates generally to sensor systems, and more specifically to an atomic magnetometer.

BACKGROUND

Magnetometer systems, such as nuclear magnetic resonance (NMR) magnetometers and/or electron paramagnetic resonance (EPR) magnetometers, can include a cell that contains one or more alkali metal vapors, such as rubidium or cesium, which can exhibit precession characteristics that can be a function of an external magnetic field. Thus, the magnetometer system can be configured to detect the external magnetic field based on the precession characteristics of the alkali metal vapor(s). Typical magnetometer systems that implement detection of the external magnetic field in three vector axes implement a combination of multiple single-axis or dual-axis vector systems. Such magnetometer systems can typically exhibit sensitivities to dynamics or system misalignments when attempting to determine a whole field scalar measurement, which can result in inaccuracy. Thus, when high sensitivity and stability may be required in a dynamic environment, whole field scalar magnetometer systems are often implemented.

SUMMARY

One example includes a magnetometer that includes a sensor cell comprising alkali metal vapor and a magnetic field generator system that generates predetermined AC magnetic fields through the sensor cell. The magnetometer also includes a laser system to provide optical pump and probe beams through the sensor cell in a pulsed manner to facilitate precession of the alkali metal vapor and to provide a detection beam corresponding to the optical probe beam exiting the sensor cell. The detection beam exhibits an optical property corresponding to a modified precession of the alkali metal vapor based on the predetermined AC magnetic fields and an external magnetic field. The magnetometer also includes a detection system to monitor the detection beam to detect the modified precession of the alkali metal vapor to calculate scalar and vector components of the external magnetic field based on the plurality of predetermined AC magnetic fields.

Another example includes a method for measuring a scalar component and a vector component of an external magnetic field via a magnetometer system. The method includes providing a plurality of predetermined AC magnetic fields through a sensor cell associated with a magnetometer. The sensor cell includes an alkali metal vapor. The method also includes providing an optical probe beam and an optical pump beam through the sensor cell in a pulsed manner and determining a total magnetic field comprising the external magnetic field and each of the plurality of predetermined AC magnetic fields in response to receiving a detection beam corresponding to the optical probe beam exiting the sensor cell. The method further includes demodulating the total magnetic field based on the plurality of predetermined AC magnetic fields to calculate the scalar component and the vector component of the external magnetic field.

Another example includes a plurality of magnetometers. Each of the magnetometers includes a sensor cell comprising alkali metal vapor, a magnetic field generator system configured to generate a plurality of predetermined AC magnetic fields through the sensor cell, a laser system configured to provide an optical pump beam and an optical probe beam through the sensor cell in a pulsed manner to facilitate precession of the alkali metal vapor and to provide a detection beam corresponding to the optical probe beam exiting the sensor cell, the detection beam exhibiting an optical property corresponding to a modified precession of the alkali metal vapor based on the plurality of predetermined AC magnetic fields and an external magnetic field, and a detection system configured to monitor the detection beam to detect the modified precession of the alkali metal vapor to calculate a scalar component and to calculate a vector component of the external magnetic field based on the plurality of predetermined AC magnetic fields. The system further includes a magnetic field tensor processor configured to calculate a magnetic field gradient based on the scalar and vector components of the external magnetic field calculated by each of the plurality of magnetometers.

DETAILED DESCRIPTION

Figure 1:
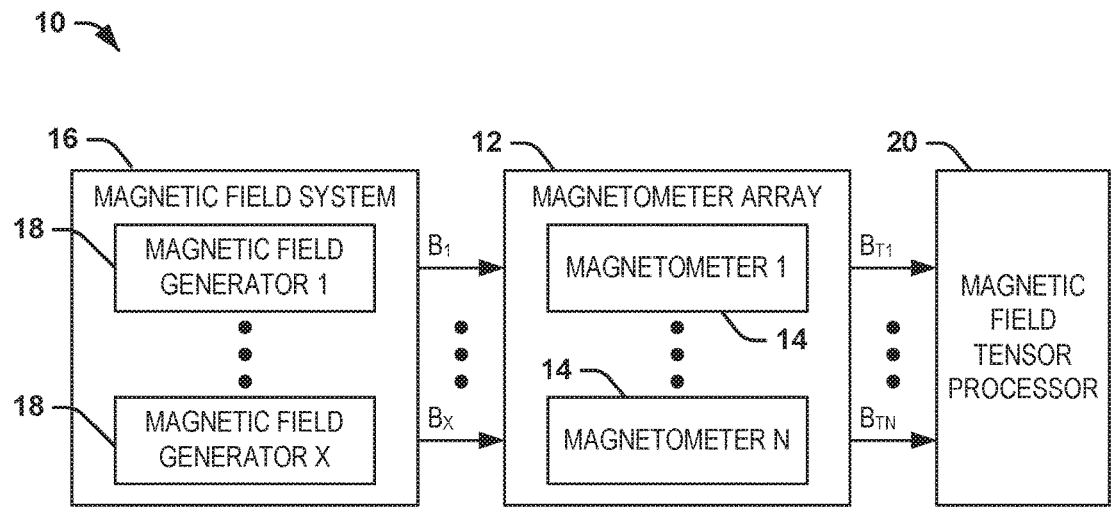
FIG. 1 illustrates an example of an atomic magnetometer system.

This disclosure relates generally to sensor systems, and more specifically to an atomic magnetometer system. The magnetometer system can include an array of magnetometers, with each magnetometer being configured as a Synchronous Light-pulse Atomic Magnetometer (SLAM) that includes a concurrent pump/pulse beam pumping and interrogation methodology, such as similar to Bell-Bloom all-optical magnetometry. The magnetometer system includes a laser system that includes at least one pump laser and at least one probe laser configured to generate a respective at least one optical pump beam and a respective at least one optical probe beam. As an example, the pump and optical probe beam(s) can be combined via an optical combiner (e.g., a 2×2 optical combiner) to provide the pump and optical probe beam(s) in a collinear manner. The pump and optical probe beam(s) are provided through a sensor cell that includes an alkali metal vapor. The alkali metal vapor can precess in response to an external magnetic field based on alignment of the net magnetic moments of the alkali metal vapor in the cell in response to the circularly-polarized optical pump beam. As a result of the precession, the linearly-polarized optical probe beam can experience a Faraday rotation as it passes through the sensor cell, with the Faraday rotation being based on the instantaneous orientation of the net magnetic moments of the alkali metal vapor as the alkali metal vapor precesses. Therefore, detection beam(s) corresponding to the optical probe beam(s) exiting the sensor cell can be monitored to monitor the precession of the alkali metal vapor.

As an example, the monitored precession of the alkali metal vapor can be provided as feedback to a timing controller to generate a timing signal. The timing signal can thus be provided to the laser system to provide a timing reference as to when to provide the pulsed optical pump beam and optical probe beam through the sensor cell. For example, the laser system can provide an optical pump beam pulse through the sensor cell in response to the timing signal to pump the alkali metal vapor once each period of the precession (e.g., when the magnetic moments are aligned approximately parallel with the optical pump beam axis). As another example, the laser system can provide an optical probe beam pulse through the sensor cell in response to the timing signal when the magnetic moments of the alkali metal vapor are approximately parallel and anti-parallel with the optical probe beam axis to calibrate the magnetometer system. Furthermore, the laser system can provide an optical probe beam pulse through the sensor cell in response to the timing signal when the magnetic moments of the alkali metal vapor are approximately orthogonal with the optical probe beam axis to monitor the amplitude and direction of the external magnetic field, as indicated by the Faraday rotation of the linear polarization.

In addition, each of the magnetometers can be implemented to calculate a vector magnitude of the external magnetic field. For example, the atomic magnetometer system can include a magnetic field system that includes a plurality of magnetic field generators that are each configured to generate a predetermined AC magnetic field along a respective predetermined axis through the sensor cell of each of the magnetometers. As an example, the magnetic fields can be provided as three orthogonal magnetic fields that each have a separate respective frequency. The square of the total magnetic field measured by a respective one of the magnetometers can be equal to a sum of each of the vector terms, with each vector term comprising a sum of the vector component of the external magnetic field and a corresponding one of the predetermined magnetic fields squared. Therefore, the detection system is configured to square the measured total magnetic field and demodulate the squared total magnetic field by first and second harmonics associated with the predetermined AC magnetic fields to calculate the scalar and vector components of the external magnetic field. Furthermore, by comparing the scalar and vector components of the external magnetic field measured by each of the magnetometers in the array, the atomic magnetometer system can operate as a tensor system to determine a magnetic field gradient of the external magnetic field.

FIG. 1 illustrates an example of a magnetometer system 10. The magnetometer system 10 can be implemented in any of a variety of applications to measure an external magnetic field, such as navigation. For example, the magnetometer system 10 can be implemented in an inertial navigation system (INS) for an aircraft or a spacecraft to assist with real-time navigation or location determination. As described herein, the magnetometer system 10 can be implemented to measure scalar and vector components of the external magnetic field, as well as to determine a magnetic field gradient associated with the external magnetic field.

The magnetometer system 10 includes a magnetometer array 12 that includes a plurality N of magnetometers 14, where N is a positive integer greater than one. As an example, each of the magnetometers 14 can be configured as atomic magnetometers (e.g., Synchronous Light-pulse Atomic Magnetometers (SLAMs)) that are each configured to separately measure an external magnetic field. As described in greater detail herein, each of the magnetometers 14 includes a sensor cell through which the external magnetic field is provided for measurement. The magnetometer system 10 also includes a magnetic field system 16 that includes a plurality X of magnetic field generators 18, where X is a positive integer greater than one. In the example of FIG. 1, each of the magnetic field generators 18 is configured to generate a predetermined AC magnetic field, demonstrated as $B_1$ through $B_X$. Each of the predetermined AC magnetic fields $B_1$ through $B_X$ is provided through the sensor cell of each of the magnetometers 14 in the magnetometer array 12.

For example, each of the magnetometers 14 can be implemented to calculate a vector magnitude of the external magnetic field. As an example, the predetermined AC magnetic fields $B_1$ through $B_X$ generated by the respective magnetic field generators 18 can each be provided along a respective predetermined axis through the sensor cell of each of the magnetometers 14. As an example, the magnetic fields $B_1$ through $B_X$ can be provided as three orthogonal magnetic fields, provided at respective X, Y, and Z orthogonal axes. Additionally, the magnetic fields $B_1$ through $B_X$ each have a separate respective frequency that is unique with respect to each other. As a result, and as described in greater detail herein, each of the magnetometers 14 can be configured to demodulate a total measured magnetic field by the predetermined AC magnetic fields to determine the vector components of the external magnetic field.

In the example of FIG. 1, each of the magnetometers 14 is configured to generate a measurement of the external magnetic field, demonstrated as $B_{T1}$ through $B_{TN}$, respectively. The measurements $B_{T1}$ through $B_{TN}$ can, for example, include scalar and vector components of the external magnetic field. The measurements $B_{T1}$ through $B_{TN}$ are provided to a magnetic field tensor processor 20 that is configured to process the measurements $B_{T1}$ through $B_{TN}$ relative to physical locations of the magnetometers 14 in three-dimensional space. Therefore, by comparing the scalar and/or vector components of the amplitude of the external magnetic field relative to the physical locations of the magnetometers 14 in three-dimensional space, the magnetic field tensor processor 20 can be configured to determine a magnetic field gradient associated with the external magnetic field. Accordingly, the magnetic field tensor processor 20 can facilitate use of the atomic magnetometer system 10 as a tensor sensor in addition to a magnetometer sensor to facilitate measurement of the external magnetic field.

Figure 2:
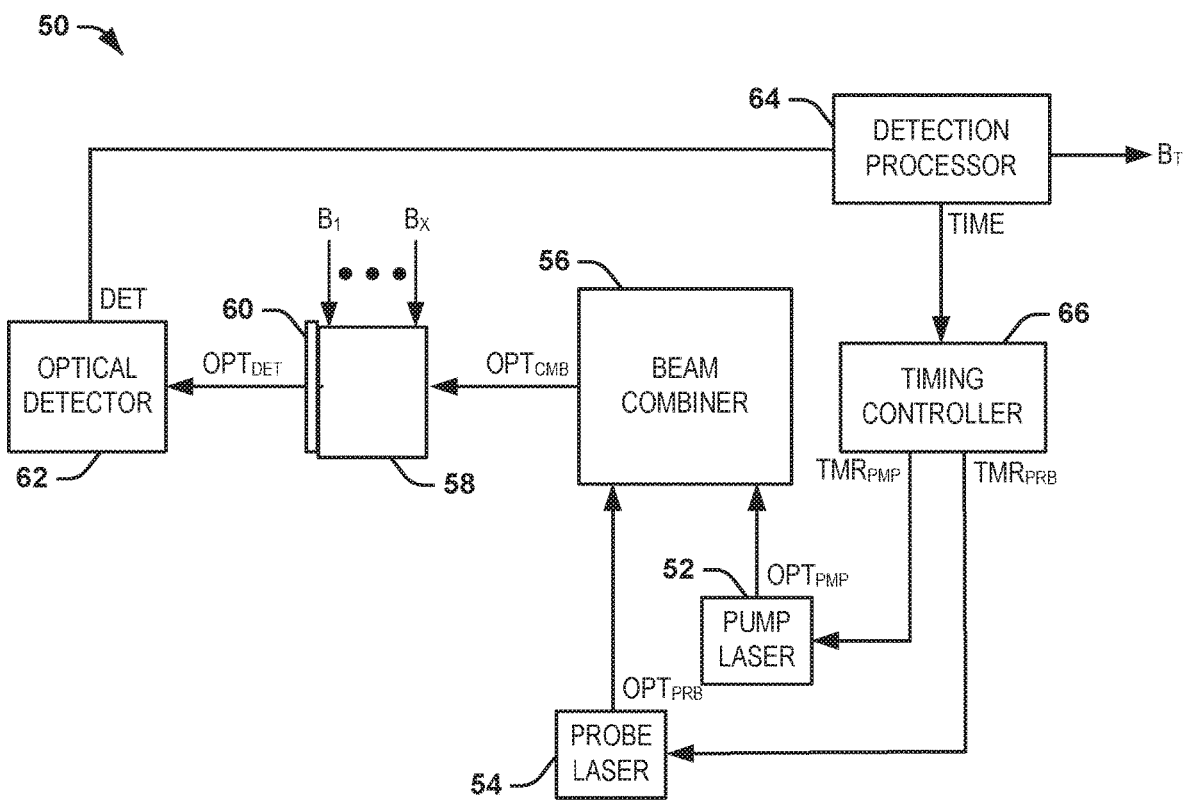
FIG. 2 illustrates an example of a magnetometer.

FIG. 2 illustrates an example of a magnetometer 50. The magnetometer 50 can correspond to a single one of the magnetometers 14 in the magnetometer array 12 in the example of FIG. 1. Therefore, reference is to be made to the example of FIG. 1 in the following description of the example of FIG. 2.

The magnetometer system 50 includes a pump laser 52 and a probe laser 54. The pump laser 52 is configured to generate an optical pump beam $OPT_{PMP}$, and the probe laser 54 is configured to generate an optical probe beam $OPT_{PRB}$. The optical pump beam $OPT_{PMP}$ and the optical probe beam $OPT_{PRB}$ are combined via a beam combiner 56. As an example, the beam combiner 56 can be configured as a 2×2 optical combiner to provide power efficient optical coupling (e.g., as opposed to a 2×1 optical combiner that can exhibit a 3 dB loss). The beam combiner 56 is demonstrated as providing a combined beam axis, demonstrated in the example of FIG. 2 as $OPT_{CMB}$. The combined beam axis $OPT_{CMB}$ can correspond to a coaxial combination of the optical pump beam $OPT_{PMP}$ and the optical probe beam $OPT_{PRB}$. It is to be understood that the optical pump beam $OPT_{PMP}$ and the optical probe beam $OPT_{PRB}$ are not necessarily concurrently provided together as the combined beam axis $OPT_{CMB}$, but merely share an optical axis.

The combined beam axis, demonstrated in the example of FIG. 2 as $OPT_{CMB}$, is provided through a sensor cell 58 that includes an alkali metal vapor disposed therein. The optical pump beam OPT$_{PMP}$ can be provided through the sensor cell 58 to facilitate precession of the alkali metal vapor in the sensor cell 58 in response to the external magnetic field. Therefore, the optical pump beam OPT$_{PMP}$ can align the magnetic moment of the alkali metal vapor in an approximately parallel manner with respect to the optical pump beam OPT$_{PMP}$. Therefore, the alkali metal vapor can precess about the external magnetic field based on the alignment of the magnetic moment of the alkali metal vapor, as described in greater detail herein.

In the example of FIG. 2, a dichroic mirror 60 is demonstrated on the opposite side of the sensor cell 58 to stop the optical pump beam OPT$_{PMP}$ but to allow a detection beam OPT$_{DET}$ corresponding to the optical probe beam OPT$_{PRB}$ passing through the sensor cell 58 to pass to an optical detector 62. The optical detector 62 is configured to detect the Faraday rotation of the optical probe beam OPT$_{PRB}$ through the sensor cell 58 based on the detection beam OPT$_{DET}$. The optical detector 62 can provide a detection signal DET to a detection processor 64. In response to the detection signal DET, the detection processor 64 can generate scalar and vector components, demonstrated as the measurement BT, of the external magnetic field, as described herein.

In the example of FIG. 2, the sensor cell 58 is demonstrated as receiving the predetermined AC magnetic fields B$_1$ through B$_X$. Additionally, the detection processor 64 can be programmed with the frequency and vector orientation of each of the predetermined AC magnetic fields B$_1$ through B$_X$. As a result, the detection processor 64 can take advantage of the relationship between the squares of the vector components of magnetic field relative to the total magnetic field measured through the sensor cell 58. For example, the square of the total magnetic field measured by the detection processor 64 can be equal to a sum of each of the orthogonal vector terms of magnetic field, with each orthogonal vector term comprising a sum of the vector component of the external magnetic field and a corresponding one of the predetermined magnetic fields B$_1$ through B$_X$ squared, as described below:

$$B_{TOT}^2 = B_X^2 + B_Y^2 + B_Z^2 \qquad \text{Equation 1}$$

Where: B$_{TOT}$ is a total magnetic field measured through the sensor cell 58;

B$_X$ is sum of the X-axis component of the external magnetic field and an X-axis component of at least one of the predetermined AC magnetic fields (e.g., a predetermined AC magnetic field provided along the X-axis);

B$_Y$ is sum of the Y-axis component of the external magnetic field and a Y-axis component of at least one of the predetermined AC magnetic fields (e.g., a predetermined AC magnetic field provided along the Y-axis); and B$_Z$ is sum of the Z-axis component of the external magnetic field and a Z-axis component of at least one of the predetermined AC magnetic fields (e.g., a predetermined AC magnetic field provided along the Z-axis).

Therefore, the detection processor 64 is configured to square the measured total magnetic field B$_{TOT}$ and to demodulate the squared total magnetic field B$_{TOT}^2$ by first and second harmonics associated with the predetermined AC magnetic fields B$_1$ through B$_X$ to calculate the scalar and vector components of the external magnetic field. For example, any individual total vector component B$_i$ can be calculated as follows:

$$B_i^2 = (B_{EXT,i} + B_{AC,i}\text{Cos}(\omega_i t))^2 \qquad \text{Equation 2}$$

$$= B_{EXT,i}^2 + 2B_{EXT,i}B_{AC,i}\text{Cos}(\omega_i t) + B_{AC,i}^2\text{Cos}^2(\omega_i t) \qquad \text{Equation 3}$$

$$= B_{EXT,i}^2 + 2B_{EXT,i}B_{AC,i}\text{Cos}(\omega_i t) + B_{AC,i}^2 * \frac{1}{2}(1 + \text{Cos}(2\omega_i t)) \qquad \text{Equation 4}$$

Where: B$_{EXT}$ is the external magnetic field; and
B$_{AC}$ is the corresponding one of the predetermined AC magnetic fields.

Accordingly, Equations 2-4 demonstrate that the first and second harmonics contain the product of the external and AC vector components and the square of the AC vector component, respectively.

In addition, the detection processor 64 can generate and adjust a timing reference TIME that is provided to a timing controller 66 to implement the pulse timing of the optical pump beam OPT$_{PMP}$. The timing controller 66 can generate a timing signal TMR$_{PMP}$ that is provided to the pump laser 52 to indicate the timing of activation of the pulses of the optical pump beam OPT$_{PMP}$. Similarly, the timing controller 66 can generate a timing signal TMR$_{PRB}$ that is provided to the probe laser 54 to indicate the timing of activation of the pulses of the optical probe beam OPT$_{PRB}$. Therefore, the magnetometer 50 can operate as a SLAM, similar to as described in U.S. Publication No. 2018/0348313, which is incorporated herein in its entirety by reference.

Figure 3:
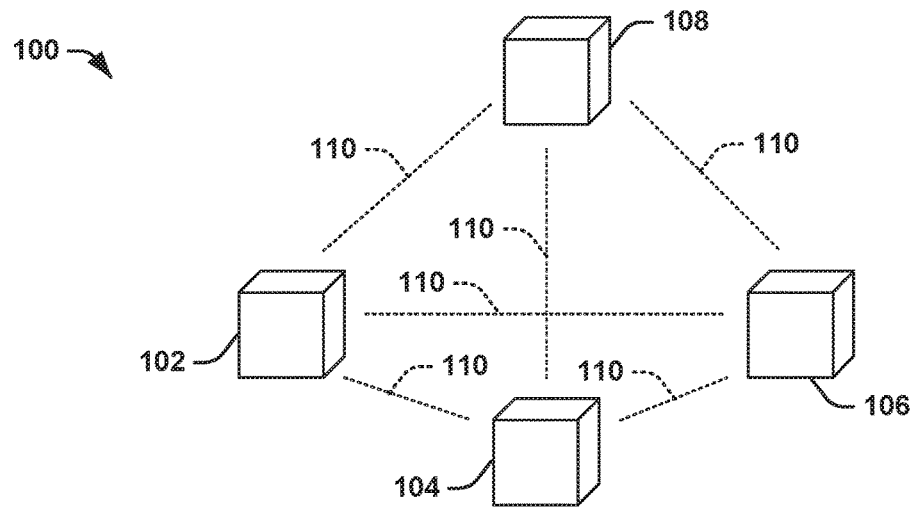
FIG. 3 illustrates an example of a magnetometer array.

As described previously, the magnetometers 14 are arranged in a predetermined physical array in the magnetometer array 12, such that the magnetic field tensor processor 20 can calculate a magnetic field gradient associated with the external magnetic field based on the predetermined physical arrangement. FIG. 3 illustrates an example of a magnetometer array 100. The magnetometer array 100 can correspond to the magnetometer array 12 in the example of FIG. 1. Therefore, reference is to be made to the examples of FIGS. 1 and 2 in the following description of the example of FIG. 3.

The magnetometer array 100 includes a plurality of magnetometers, demonstrated as a magnetometer 102, a magnetometer 104, a magnetometer 106, and a magnetometer 108. The magnetometers 102, 104, 106, and 108 can each be configured substantially similar to the magnetometers 14 and the magnetometer 50 in the respective examples of FIGS. 1 and 2. Therefore, each of the magnetometers 102, 104, 106, and 108 is configured to calculate scalar and vector components of the external magnetic field, such as based on demodulating the square of the total measured magnetic field by the first and second order harmonics of the predetermined AC magnetic fields B$_1$ through B$_X$.

In the example of FIG. 3, the magnetometers 102, 104, 106, and 108 are arranged in a three-dimensional geometric array. In the example of FIG. 3, the three-dimensional geometric array is demonstrated as an equilateral pyramid, such that each of the magnetometers 102, 104, 106, and 108 are equidistant from each other as indicated by the dotted lines 110 of approximately equal length. For example, the magnetometers 102, 104, and 106 are arranged in a first planar array, the magnetometers 102, 104, and 108 are arranged in a second planar array, the magnetometers 102, 106, and 108 are arranged in a third planar array, and the magnetometers 104, 106, and 108 are arranged in a fourth planar array. Therefore, a magnetic field gradient associated with the external magnetic field can be measured based on a difference in the scalar and/or vector components of the external magnetic field as measured by each of the magnetometers 102, 104, 106, and 108 (e.g., based on the measurements $B_{T1}$ through $B_{T4}$, similar to as described in the example of FIG. 1 for N=4).

As an example, the magnetic field gradient of the external magnetic field can be determined from one of the planar arrays, with the out-of-plane one of the magnetometers 102, 104, 106, and 108 being implemented as a redundant sensor to provide calibration of the atomic magnetometer system 10 and/or to provide the magnetic field gradient along the normal axis with respect to the respective one of the planar arrays with which the magnetic field gradient is measured. Therefore, while the three-dimensional geometric array is demonstrated as an equilateral pyramid, it is to be understood that a variety of other types of three-dimensional geometric arrays is possible. For example, three of the magnetometers 102, 104, 106, and 108 can be arranged in a linear array and the fourth one of the magnetometers 102, 104, 106, and 108 can be arranged in a skewed manner relative to the linear array. Other planar arrays and out-of-plane arrangements of the magnetometers 102, 104, 106, and 108 is also possible. Furthermore, the magnetometer array 100 is not limited to four magnetometers, but can include more or fewer magnetometers than the four magnetometers 102, 104, 106, and 108. Accordingly, the magnetometer array can be arranged in any of a variety of ways.

As another example, the magnetometers of the magnetometer array 12 can be arranged in more complex arrays to measure higher-order gradients. For example, a higher-order gradient can be measured by arranging planar arrays of the planar arrays of the magnetometers 14. As an example, one such arrangement can include an array comprising a hexagonal arrangement of magnetometers 14, with one magnetometer 14 being included at the center of the hexagonal arrangement, thus effectively providing a circularly symmetric array of equilateral triangles, with each equilateral triangle sharing the central magnetometer 14 as a vertex. Such an arrangement allows measurement of the second order tensor that includes measurement of all the second order gradients in addition to the linear gradients, vector components, and scalar magnitude.

Figure 4:
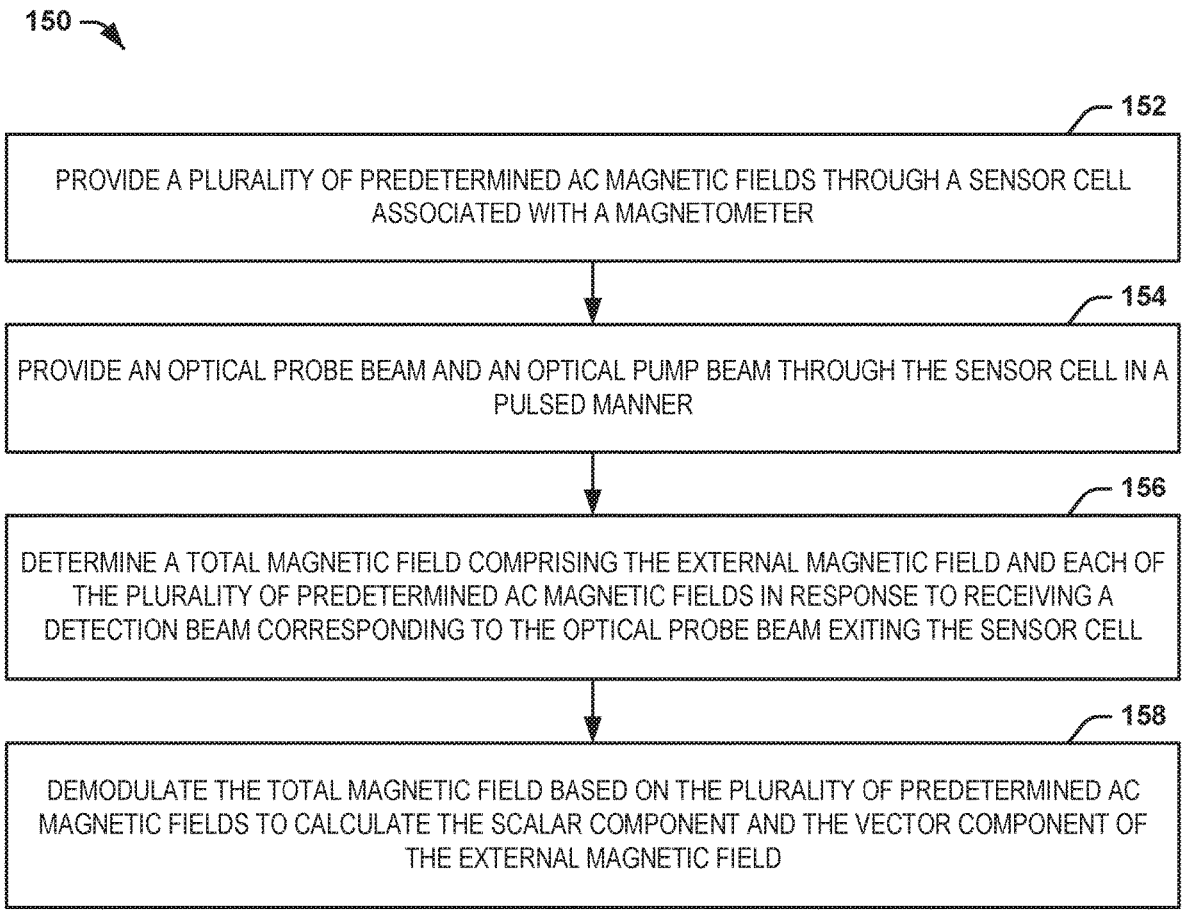
FIG. 4 illustrates an example of a method for measuring an external magnetic field.

In view of the foregoing structural and functional features described above, a methodology in accordance with various aspects of the present invention will be better appreciated with reference to FIG. 4. While, for purposes of simplicity of explanation, the methodology of FIG. 4 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 4 illustrates an example of a method 150 for measuring a scalar component and a vector component of an external magnetic field via a magnetometer system (e.g., the atomic magnetometer system 10). At 152, a plurality of predetermined AC magnetic fields (e.g., the magnetic fields $B_1$ through $B_X$) are provided through a sensor cell (e.g., the sensor cell 58) associated with a magnetometer (e.g., one of the magnetometers 14). The sensor cell includes an alkali metal vapor. At 154, an optical probe beam (e.g., the optical probe beam $OPT_{PRB}$) and an optical pump beam (e.g., the optical pump beam $OPT_{PMP}$) through the sensor cell in a pulsed manner. At 156, a total magnetic field (e.g., the total magnetic field $B_{TOT}$) including the external magnetic field and each of the plurality of predetermined AC magnetic fields is measured in response to receiving a detection beam (e.g., the detection beam $OPT_{DET}$) corresponding to the optical probe beam exiting the sensor cell. At 158, the total magnetic field is demodulated based on the plurality of predetermined AC magnetic fields to calculate the scalar component and the vector component of the external magnetic field.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A magnetometer comprising:
    a sensor cell comprising alkali metal vapor;
    a magnetic field generator system configured to generate a plurality of predetermined AC magnetic fields through the sensor cell;
    a laser system configured to provide an optical pump beam and an optical probe beam through the sensor cell in a pulsed manner to facilitate precession of the alkali metal vapor and to provide a detection beam corresponding to the optical probe beam exiting the sensor cell, the detection beam exhibiting an optical property corresponding to a modified precession of the alkali metal vapor based on the plurality of predetermined AC magnetic fields and an external magnetic field; and
    a detection system configured to monitor the detection beam to detect the modified precession of the alkali metal vapor and measure a total magnetic field comprised of the external magnetic field and the plurality of predetermined AC magnetic fields, the detection system being further configured to square the measured total magnetic field and demodulate the measured squared total magnetic field by first and second harmonics associated with the predetermined AC magnetic fields to calculate a scalar component and to calculate a vector component of the external magnetic field based on the plurality of predetermined AC magnetic fields.

2. The magnetometer of claim 1, wherein the laser system comprises an optical coupler configured to axially combine the optical pump beam and the optical probe beam to generate a combined beam that is directed through the sensor cell.

3. The magnetometer of claim 1, wherein each of the plurality of AC magnetic fields is provided at a separate respective frequency, such that the detection system is configured to demodulate the total magnetic field by each separate respective frequency of the respective plurality of predetermined AC magnetic fields to calculate the scalar and vector components of the external magnetic field.

4. The magnetometer of claim 1, wherein the plurality of predetermined AC magnetic fields are provided at predetermined relative angles with respect to each other in three dimensional space, such that the detection system is configured to demodulate the total magnetic field by each of the respective plurality of predetermined AC magnetic fields to determine the vector components of the external magnetic field relative to the predetermined relative angles of the plurality of predetermined AC magnetic fields.

5. The magnetometer of claim 4, wherein the plurality of predetermined AC magnetic fields comprises three AC magnetic fields that are each approximately orthogonal with respect to each other.

6. The magnetometer of claim 1, wherein the optical probe beam and the optical pump beam are provided in a pulsed manner at a frequency corresponding to a precession frequency of the alkali metal vapor.

7. A magnetometer system comprising a plurality of magnetometers of claim 1 that are arranged in an array and each configured to calculate the scalar and vector components of the external magnetic field, the magnetometer system further comprising a magnetic field tensor processor configured to calculate a magnetic field gradient associated with the external magnetic field.

8. The magnetometer system of claim 7, wherein at least a portion of the plurality of magnetometers are arranged in a planar array.

9. The magnetometer system of claim 8, wherein at least one of the plurality of magnetometers is offset from the planar array to provide a redundant calculation of the scalar and vector components of the external magnetic field.

10. A method for measuring a scalar component and a vector component of an external magnetic field via a magnetometer system, the method comprising:
providing a plurality of predetermined AC magnetic fields through a sensor cell associated with a magnetometer, the sensor cell comprising an alkali metal vapor;
providing an optical probe beam and an optical pump beam through the sensor cell in a pulsed manner;
determining a total magnetic field comprising the external magnetic field and each of the plurality of predetermined AC magnetic fields in response to receiving a detection beam corresponding to the optical probe beam exiting the sensor cell;
squaring the total magnetic field; and
demodulating the squared total magnetic field by first and second harmonics associated with the plurality of predetermined AC magnetic fields to calculate the scalar component and the vector component of the external magnetic field.

11. The method of claim 10, wherein providing the optical pump beam and providing the optical probe beam comprises axially combining the optical probe beam and the optical pump beam to provide a combined beam through the sensor cell in a pulsed manner that is based on a precession frequency of the alkali metal vapor.

12. The method of claim 10, wherein providing the plurality of predetermined AC magnetic fields comprises providing the plurality of predetermined AC magnetic fields at separate respective frequencies and at separate predetermined relative angles with respect to each other in three dimensional space, such that the detection system is configured to demodulate the total magnetic field by each separate respective frequency of the respective plurality of predetermined AC magnetic fields and relative to each separate predetermined relative angle to calculate the scalar and vector components of the external magnetic field.

13. The method of claim 10, further comprising:
determining the scalar and vector components of the external magnetic field via each of a plurality of magnetometers arranged in a planar array; and
determining a magnetic field gradient based on the determination of the scalar and vector components of the external magnetic field via each of a plurality of magnetometers.

14. A magnetometer system comprising:
a plurality of magnetometers, each of the magnetometers comprising:
a sensor cell comprising alkali metal vapor;
a magnetic field generator system configured to generate a plurality of predetermined AC magnetic fields through the sensor cell;
a laser system configured to provide an optical pump beam and an optical probe beam through the sensor cell in a pulsed manner to facilitate precession of the alkali metal vapor and to provide a detection beam corresponding to the optical probe beam exiting the sensor cell, the detection beam exhibiting an optical property corresponding to a modified precession of the alkali metal vapor based on the plurality of predetermined AC magnetic fields and an external magnetic field; and
a detection system configured to monitor the detection beam to detect the modified precession of the alkali metal vapor to calculate a scalar component and to calculate a vector component of the external magnetic field based on the plurality of predetermined AC magnetic fields; and
a magnetic field tensor processor configured to calculate a magnetic field gradient based on the scalar and vector components of the external magnetic field calculated by each of the plurality of magnetometers.

15. The system of claim 14, wherein each of the plurality of AC magnetic fields is provided at a separate respective frequency and wherein the plurality of predetermined AC magnetic fields are provided at predetermined relative angles with respect to each other in three dimensional space, such that the detection system of each of the magnetometers is configured to demodulate a total magnetic field by each separate respective frequency of the respective plurality of predetermined AC magnetic fields and relative to the predetermined relative angles of the plurality of predetermined AC magnetic fields to calculate the scalar and vector components of the external magnetic field.

16. The system of claim 14, wherein the detection system of each of the magnetometers is configured to square the total magnetic field and to demodulate the squared total magnetic field by first and second harmonics associated with the plurality of predetermined AC magnetic fields to calculate the scalar and vector components of the external magnetic field.

17. The system of claim 14, wherein a portion of the magnetometers are arranged in a planar array, and wherein at least one of the plurality of magnetometers is offset from the planar array to provide a redundant calculation of the scalar and vector components of the external magnetic field.

* * * * *